United States Patent [19]

Tomisawa et al.

[11] Patent Number: 4,559,295
[45] Date of Patent: Dec. 17, 1985

[54] PROCESS FOR REGENERATING SOLUTION FOR DEVELOPING OR PEELING ALKALI-TYPE PHOTOSENSITIVE FILM

[75] Inventors: Yoshiaki Tomisawa; Toshio Takeuchi; Keijiro Honda, all of Hitachi; Susumu Takahashi, Ibaraki; Seiji Kinoda, Fujisawa, all of Japan

[73] Assignee: Hitachi Chemical Company, Ltd., Tokyo, Japan

[21] Appl. No.: 697,769

[22] Filed: Feb. 4, 1985

Related U.S. Application Data

[62] Division of Ser. No. 510,911, Jul. 5, 1983, Pat. No. 4,519,690.

[30] Foreign Application Priority Data

Aug. 6, 1982 [JP] Japan .................. 57-137822

[51] Int. Cl.[4] .................. G03C 5/24; G03C 11/24; G03F 7/26
[52] U.S. Cl. .................. 430/325; 430/331; 430/399

[58] Field of Search .............. 430/331, 399, 398, 325; 210/704, 705, 706, 712; 354/324

[56] References Cited

U.S. PATENT DOCUMENTS

| 4,081,816 | 3/1978 | Geyken et al. | 354/324 |
| 4,162,023 | 7/1979 | Green | 210/712 |
| 4,163,023 | 7/1979 | Endo et al. | 430/399 |
| 4,196,018 | 4/1980 | Inoko et al. | 134/10 |
| 4,517,282 | 5/1985 | Tomisawa et al. | 430/399 |

Primary Examiner—Richard L. Schilling
Attorney, Agent, or Firm—Antonelli, Terry & Wands

[57] ABSTRACT

A developing or peeling solution for developing or imagewisely peeling an alkali-type photosensitive film containing a suspension of released photosensitive film is regenerated by introducing one or more reagents and a gas for depositing the suspension in floating state and removing the floated deposit by a skimmer from the developing or peeling solution, while a part or whole of the resulting treated solution is taken out of the system.

4 Claims, 3 Drawing Figures

PROCESS FOR REGENERATING SOLUTION FOR DEVELOPING OR PEELING ALKALI-TYPE PHOTOSENSITIVE FILM

This is a division of application Ser. No. 510,911, filed July 5, 1983, now U.S. Pat. No. 4,519,690.

BACKGROUND OF THE INVENTION

This invention relates to a process for developing or peeling an alkali-type photosensitive film and an apparatus used therein.

Heretofore, development or peeling of alkali-type photosensitive film has been conducted batch-wise or continuously by dipping an alkali-type photosensitive film in a several percent alkaline solution or spraying a several percent alkaline solution over the alkali-type photosensitive film. During the development, unexposed portions of the alkali-type photosensitive film become a suspension in suspended state in the developing solution. During the peeling, the exposed portions become a suspension in suspended state in the peeling solution or sometimes there are present film flakes in the peeling solution.

Defects of prior art processes are that it is difficult to remove completely the suspension in suspended state by filtration even if the film flakes may be removed by filtration, and much man-power is necessary for renewal of filtering area, so that the developing or peeling solution is changed after used for treating the photosensitive film of 0.5 to 0.7 $m^2$/liter and the waste developing or peeling solution is neutralized in an alkali waste treating apparatus or is filled in drum cans for disposal. Considering water pollution, much disposal cost is necessary.

SUMMARY OF THE INVENTION

It is an object of this invention to provide a process for developing or peeling an alkali-type photosensitive film by using a regenerated developing or peeling solution wherein a suspension of very fine released photosensitive film suspended therein is removed effectively with low cost overcoming the defects of the prior art processes. It is another object of this invention to provide an apparatus used for such a process.

This invention provides a process for developing or imagewisely peeling an alkali-type photosensitive film which comprises developing or imagewisely peeling an alkali-type photosensitive film with a developing or peeling solution, taking off the developing or peeling solution containing a released photosensitive film suspension from a developing or peeling device, introducing one or more reagents and a gas into the developing or peeling solution to deposit the suspension in floc state, removing the flocculated deposit in floating state out of the developing or peeling solution, and taking a part or a whole of the resulting treated developing or peeling solution out of the system.

This invention also provides an apparatus for developing or imagewisely peeling an alkali-type photosensitive film comprising a developing or peeling device for developing or peeling an alkali-type photosensitive film with a developing or peeling solution, a solution tank for receiving the developing or peeling solution containing a released photosensitive film suspension transported from the developing or peeling device, one or more reagent tanks for storing separately one or more reagents for regenerating the developing or peeling solution, a blower for supplying a gas to the developing or peeling solution, and one or more floating tanks wherein the released photosensitive film suspension suspended in the developing or peeling solution sent from the solution tank is flocculated with the reagents from the reagent tanks and the gas from the blower and the flocculated deposit in floating state is removed from the floating tanks for taking a part or a whole of the resulting treated developing or peeling solution out of the system and passing it to a waste water treating apparatus.

DESCRIPTION OF PREFERRED EMBODIMENTS

As the device for developing or peeling an alkali-type photosensitive film usable in this invention, there are a batch-type device for dipping treatment of substrates obtained by bonding a photosensitive film and exposing to light, or substrates further treated by etching or plating, and a continuous device wherein these substrates are supplied by a roller conveyor continuously and treated by the spraying method, and the like.

Figure 1:
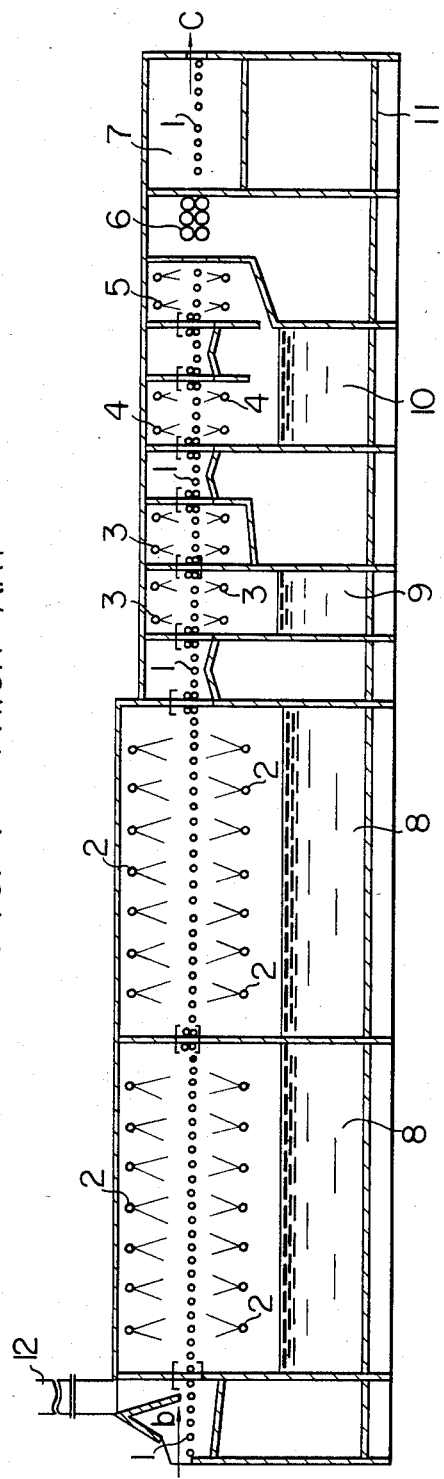
FIG. 1 is a schematic cross-sectional view of a conventional continuous spray type developing apparatus for alkali-type photosensitive film.
Figure 2:
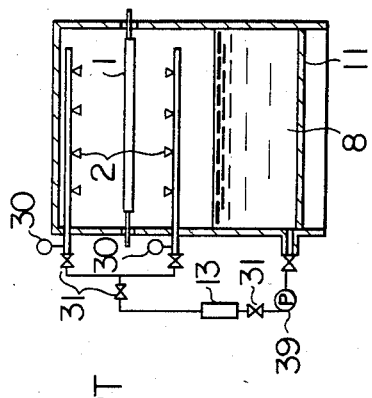
FIG. 2 is a schematic cross-sectional view of an alkali treatment portion in the continuous spray type developing apparatus.

FIG. 1 is a schematic cross-sectional view of a conventional continuous spray type developing apparatus for alkali-type photosensitive film and FIG. 2 is a schematic cross-sectional view of the alkali treatment portion in the continuous spray type developing apparatus.

Referring to FIG. 1, a substrate is supplied to the apparatus by manual operation or automatic operation to the arrowed direction "b" and sent to an outlet with a constant speed successively by a substrate transporting roll 1. In the alkali treatment portion of the apparatus, the substrate is treated by an alkali aqueous solution from sprayers 2 to dissolve and release the unexposed portions from the alkali-type photosensitive film. The substrate is then washed with water from water sprayers 3, treated with a neutralizing treatment solution from sprayers 4, followed by rinsing with water from water sprayers 5. Then, the substrate is subjected to hydro-extraction by wringer rolls 6, dried in a dring furnace 7 and moved to the arrowed direction "c" by manual or automatic operation for receiving the photosensitive film to complete the development. In FIG. 1, numeral 8 denotes an alkali aqueous solution tank, numeral 9 a water tank, numeral 10 a neutralizing solution tank, numeral 11 a developing apparatus frame, and numeral 12 an exhaust trunking.

In the case of a continuous spray type peeling apparatus for alkali-type photosensitive film, the layout is the same as mentioned above.

FIG. 2 is a schematic cross-sectional view of the alkali treatment portion of the continuous spray type developing apparatus wherein numeral 1 is the substrate transporting roll, numeral 2 alkali aqueous solution sprayers, numeral 8 an alkali aqueous solution tank, and numeral 11 a developing apparatus frame, these being the same as in FIG. 1. FIG. 2 is a cross-sectional view taking a cross-section perpendicular to the arrowed direction "b" in FIG. 1 in the alkali aqueous solution tank 8. The alkali aqueous solution in the alkali aqueous solution tank 8 is sent to the alkali aqueous solution sprayers 2 by a pump 39 through a filter 13. In FIG. 2, numeral 30 denotes a pressure gauge, and numeral 31 a valve.

Figure 3:
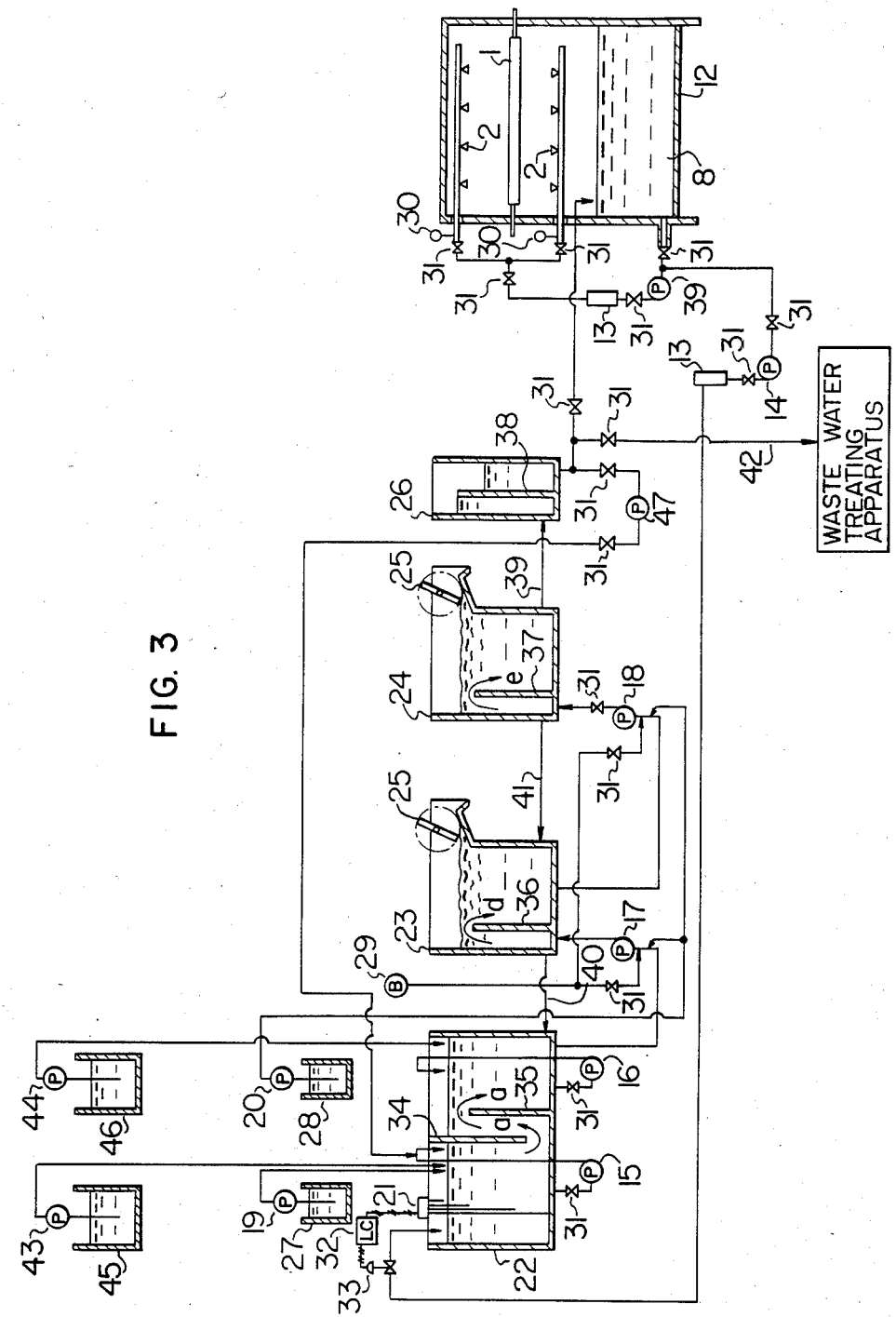
FIG. 3 is a schematic cross-sectional view of one example of an alkali-type photosensitive film developing apparatus jointed with a removing device for floated flocculated suspension according to this invention.

According to the prior art process, there is no regenerating step for the waste alkali aqueous solution, which results in causing various problems mentioned above. According to this invention, such problems are solved by using the apparatus having a removing device for floated flocculated suspension of released photosensitive film in the developing or peeling solution as shown in FIG. 3. FIG. 3 is one example of the apparatus according to this invention.

In FIG. 3, the alkali developing or peeling solution containing a suspension of released photosensitive film suspended therein is taken from the alkali aqueous solution tank 8 and sent to a solution tank 22 by a pump 14. The level of the solution tank 22 is detected by a level sensor 21 and controlled by a level controller 32 connected to a flow control valve 33. The solution separated by inner dividers 34 and 35 is circulated and stirred by pumps 15 and 16, respectively. The solution tank 22 is further equipped with a reagent tank 27 (PH reagent, a pH controlling agent), a reagent tank 45 (AB reagent, an adsorbent), a reagent tank 46 (FA reagent, a foaming agent) and reagent pouring pumps 19, 43 and 44 for providing these reagents into the solution tank 22.

The PH reagent (a pH controlling agent such as an inorganic or organic acid) is effective for forming floc from the spent alkali solution. The AB reagent (an adsorbent such as bentonite) is effective for decolorizing the treating solution and for preventing scum from sticking. The FA reagent (a foaming agent) gives floating power to scum.

A part of the solution to be treated is taken out of the solution tank 22 by a pump 17 and sent to a floating tank 23. The solution to be treated is moved to the arrowed direction "a" through the dividers 34 and 35. The dividers 34 and 35 are not always necessary.

A gas is supplied by a blower 29 to the suction side of a pump 17 and a reagent (ZA reagent or ZK reagent) is supplied from a reagent tank 28 by a pump 20 also to the suction side of the pump 17. It is preferable to supply the reagent to the suction side of the pump 17. The gas and the reagent are mixed with the solution to be treated with stirring by the pump 17 and introduced into the floating tank 23.

In the floating tank 23, the solution to be treated is moved to the arrowed direction "d" over a divider 36 and the suspension of released photosensitive film is floated in floc state, which is removed out of the tank by a skimmer 25.

The ZA and ZK reagents are individually flocculating agents such as a cationic polyamine resin and form floc good in dehydrating properties, particularly when both ZA and ZK reagents are used together.

As the gas for bubbling, there can be used an inert gas such as air, nitrogen, etc. It is preferable to bubble air in an amount of 10 1/min or less so as to form a large number of small bubbles. If the amount is too large e.g., more than 10 1/min, the bubbles become larger and will break at the liquid surface undesirably.

The solution is then passed to a floating tank 24 by a pump 18. In such a case, the solution from the floating tank 23, the gas from the blower 29 and the reagent from the reagent pump 20 are mixed with stirring by the pump 18. The resulting mixed solution is moved to the arrowed direction "e" over a divider 37 and the remaining suspension floated in floc state is removed by a skimmer 25 out of the tank. In such a case, the dividers 36 and 37 are not always necessary.

The number of floating tank depends on separation efficiency of floated floc and may be one or two or more.

It is preferable to connect the bottom of the floating tank 24 and a treated solution tank 26 for storing the treated solution by a connecting pipe 39 so as to form communicating vessels. The treated solution is moved over a divider 38 and returned to the alkali aqueous solution tank 8 by the level difference between the treated solution tank and the alkali aqueous solution tank. A part or a whole of the solution from the treated solution tank 26 is taken out of the system by a pipe 42 connected to a waste water treating apparatus (not shown in the drawing). It is preferable to recycle a part of the solution from the treated solution tank 26 to the solution tank 22 by a pump 47. In the treated solution tank 26, the divider 38 is not always necessary.

When a connecting pipe 40 and that of 41 which form communicating vessels are provided between the solution tank 22 and the floating tank 23 and between the floating tank 23 and the floating tank 24, the level balance can be controlled even if the balance in supplying amounts between the pumps 17 and 18 is lost. The connecting pipes 40 and 41 may be omitted if another level controlling method is employed.

The taking out amount of the treated solution can be controlled by making the divider 38 a dam structure. The treated solution tank 26 is provided so as to sample the treated solution and to observe transparency, coloring, bubbling, etc., with the naked eye, but it is not always necessary.

A part or whole of the treated solution taken out of the treated solution tank 26 is passed to the waste water treating apparatus through the pipe 42, but a part of the treated solution can be sent back to the alkali aqueous solution tank 8.

By using the process of this invention, there can be obtained many advantages, that is, decoloring of the treated solution is good, sticking, roping, and the like of scum are prevented and workability and maintenance characteristics are improved, and moreover it becomes possible to treat a mixed waste of a developing solution and a peeling solution.

This invention is illustrated by way of the following Examples.

EXAMPLE 1

Using a developing solution (a 2% by weight aqueous solution of $Na_2CO_3$), an alkali-type photosensitive film (PHT 860 AFT, a trade name, mfd. by Hitachi Chemical Co., Ltd.) was developed until the treating area became 0.5 m²/liter and the developing solution in suspension state was taken out continuously for regeneration using the apparatus as shown in FIG. 3. Volumes of individual tanks were 80 liters and two floating tanks were used with a treated solution tank.

Operation conditions were as follows: the taking out amount of the solution to be treated was 0.05 m³/hr, the pouring amount of the reagent (PH reagent, H₂SO₄) from the tank 27 to 50 ml of the solution to be treated was 0.1% by volume, the pouring amount of the reagent (AB reagent, bentonite) from the tank 45 to 50 ml of the solution to be treated was 0.5% by volume, the pouring amount of the reagent (FA reagent, Neopelex F-25,

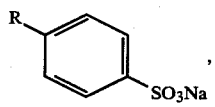

manufactured by Kao Soap Co., Ltd.) from the tank 46 to 50 ml of the solution to be treated was 0.1% by volume, the pouring amount of the reagent (ZA reagent, a flocculating agent, mfd. by Kyoritsu Yuki Kogyo Kenkyusho) from the tank 28 to 50 ml of the solution to be treated was 1% by volume, the blowing amount of air was 10 1/min or less.

The separation efficiency of the suspension was more than 85%.

EXAMPLE 2

Using a peeling solution (a 5% by weight aqueous solution of NaOH), an alkali-type photosensitive film (PHT 860 AFT, a trade name, mfd. by Hitachi Chemical Co., Ltd.) was treated until the treating area became 0.5 m²/liter and the peeling solution in suspension state was taken out continuously for regeneration using the apparatus as shown in FIG. 3. Volumes of individual tanks, the number of floating tanks and the like were the same as in Example 1.

Operation conditions were as follows: the taking out amount of the solution to be treated was 0.05 m³/hr, the pouring amount of the reagent (PH reagent, H₂SO₄) from the tank 27 to 50 ml of the solution to be treated was 4% by volume, the pouring amount of the reagent (AB reagent, bentonite) from the tank 45 to 50 ml of the solution to be treated was 7% by volume, the pouring amount of the reagent (FA reagent, Neopelex F-25) from the tank 46 to 50 ml of the solution to be treated was 0.1% by volume, the pouring amount of the reagent (ZK reagent, a flocculating agent, mfd. by Kyoritsu Yuki Kogyo Kenkyusho) from the tank 28 to 50 ml of the solution to be treated was 5% by volume, the blowing amount of air was 10 1/min or less.

The separation efficiency of the suspension was more than 95%.

What is claimed is:

1. A process for developing or imagewisely peeling an alkali-type photosensitive film which comprises
    developing or imagewisely peeling an alkali-type photosensitive film with a developing or peeling solution,
    taking off the developing or peeling solution containing a released photosensitive film suspension from a developing or peeling device,
    introducing one or more reagents and a gas into the developing or peeling solution to deposit the suspension in floc state,
    removing the flocculated deposit in floating state out of the developing or peeling solution, and
    taking a part or whole of the resulting treated developing or peeling solution out of the system.

2. A process according to claim 1, wherein the reagent for depositing the suspension is at least a flocculating agent.

3. A process according to claim 1, wherein the reagents are a pH controlling agent, an adsorbent and a foaming agent.

4. A process according to claim 1, wherein the gas for floating the deposited suspension is a bubbling air.

* * * * *